US012106797B2

(12) United States Patent
Jung et al.

(10) Patent No.: US 12,106,797 B2
(45) Date of Patent: Oct. 1, 2024

(54) BIT LINE SENSE AMPLIFIER AND SEMICONDUCTOR MEMORY APPARATUS USING THE SAME

(71) Applicant: INDUSTRY-ACADEMIC COOPERATION FOUNDATION, YONSEI UNIVERSITY, Seoul (KR)

(72) Inventors: Seong Ook Jung, Seoul (KR); In Jun Jung, Seoul (KR); Tae Hyun Kim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 189 days.

(21) Appl. No.: 17/859,153

(22) Filed: Jul. 7, 2022

(65) Prior Publication Data
US 2023/0036684 A1 Feb. 2, 2023

(30) Foreign Application Priority Data
Jul. 27, 2021 (KR) .......... 10-2021-0098739

(51) Int. Cl.
G11C 11/34 (2006.01)
G11C 11/408 (2006.01)
G11C 11/4093 (2006.01)
G11C 11/4094 (2006.01)
H03K 19/017 (2006.01)

(52) U.S. Cl.
CPC ...... *G11C 11/4093* (2013.01); *G11C 11/4085* (2013.01); *G11C 11/4094* (2013.01); *H03K 19/01742* (2013.01)

(58) Field of Classification Search
CPC ............ G11C 11/4093; G11C 11/4085; G11C 11/4094; H03K 19/01742
USPC ...................................................... 365/185.21
See application file for complete search history.

(56) References Cited

U.S. PATENT DOCUMENTS

| 9,202,531 | B2* | 12/2015 | Seo ........................ G11C 7/065 |
| 9,384,802 | B2* | 7/2016 | Park ........................ G11C 7/065 |
| 10,074,408 | B2* | 9/2018 | Seo ..................... G11C 11/4091 |
| 10,163,481 | B1* | 12/2018 | Vimercati .............. G11C 7/065 |
| 10,348,252 | B2* | 7/2019 | Jeong .................... H03F 1/0205 |
| 10,726,886 | B2* | 7/2020 | Choi ................... G11C 11/4091 |
| 10,950,279 | B2* | 3/2021 | Jeong .................... H03F 1/0205 |
| 11,024,365 | B1* | 6/2021 | Seo ..................... G11C 11/4091 |
| 11,501,824 | B2* | 11/2022 | Lee ..................... G11C 11/4091 |

(Continued)

FOREIGN PATENT DOCUMENTS

KR 10-2019-0001769 A 1/2019

*Primary Examiner* — Viet Q Nguyen

(57) ABSTRACT

A bit line sense amplifier includes: a first inverter having an input terminal connected to a first sensing node and an output terminal connected to a second inner bit line; a second inverter having an input terminal connected to a second sensing node and an output terminal connected to a first inner bit line; a first capacitor connected between the first sensing node and the first inner bit line; a second capacitor connected between the second sensing node and the second inner bit line; an isolation unit configured to cut off a connection between the first inner bit line and a second bit line; and an offset cancellation unit configured to connect the first sensing node to the second inner bit line, the first inner bit line to the first bit line, the second sensing node to the first inner bit line, and the second inner bit line to the second bit line.

17 Claims, 7 Drawing Sheets

(56) References Cited

U.S. PATENT DOCUMENTS

| | | | |
|---|---|---|---|
| 11,854,606 B2 * | 12/2023 | Cheng | G11C 11/4094 |
| 11,862,285 B2 * | 1/2024 | Lin | G11C 7/12 |
| 11,869,587 B2 * | 1/2024 | Bedeschi | G11C 13/004 |
| 11,887,655 B2 * | 1/2024 | Lu | G11C 11/4091 |
| 11,894,047 B2 * | 2/2024 | Peng | G11C 11/4091 |
| 11,894,048 B2 * | 2/2024 | Shang | G11C 7/065 |
| 2011/0133809 A1 * | 6/2011 | Goel | G11C 11/4091 |
| | | | 327/307 |
| 2022/0328093 A1 * | 10/2022 | Chang | G11C 7/065 |

* cited by examiner

BIT LINE SENSE AMPLIFIER AND SEMICONDUCTOR MEMORY APPARATUS USING THE SAME

CROSS REFERENCE TO RELATED APPLICATION

This application claims priority under 35 U.S.C. § 119(a) to Korean Patent Application No. 10-2021-0098739, filed on Jul. 27, 2021, which is hereby incorporated by reference for all purposes as if fully set forth herein.

BACKGROUND

1. Field of the Invention

The present disclosure relates to a bit line sense amplifier and a semiconductor memory apparatus using the same, and more particularly, to a low-latency bit line sense amplifier capable of performing a high-speed sensing operation while eliminating a bit line offset and improving sensing accuracy and a semiconductor memory apparatus using the same.

2. Discussion of Related Art

In the case of a semiconductor memory apparatus, particularly a dynamic random-access memory (DRAM), high speed, low power consumption, and high integration have been achieved due to rapid development. As a result, memory capacity of the DRAM has increased by more than 100 times in recent decades, but an access latency (tRC (Row Cycle Time)) and an activation latency (tRCD (Row Address to Column Address Delay)) of the DRAM have decreased by only 23.75% and 31.25%, respectively. As a result, a processor has to wait hundreds of clock cycles to access data stored in the DRAM, so that the latency of the DRAM becomes a main factor causing a large bottleneck in overall system performance.

FIG. 1 is a view for describing a sensing yield according to an operation of a sense amp.

As shown in FIG. 1, in the sense amp, a voltage stored in a memory cell Cell is charge-shared with a corresponding bit line BLT according to data, and when a voltage change corresponding to a voltage variation ΔV is generated in the bit line BLT, a resulting voltage difference $\Delta V_{BL}$ between a pair of bit lines BLT and BLB is sensed and amplified to determine data stored in the cell.

In addition, a sensing yield indicating a sensing success rate of the sense amplifier is expressed as the number of normally determined data samples with respect to the total number of determined data samples as shown in Equation 1.

$$\text{Sensing yield} = \frac{\text{\# of correct samples}}{\text{\# of total samples}} \times 100 \qquad \text{[Equation 1]}$$

A sensing fail in which the sense amplifier erroneously determines the data of the memory cell occurs mainly due to two factors. Referring to FIG. 1, a first factor of the sensing fail is an offset fail in which a sign of a voltage difference $\Delta V_{BL}$ of the pair of bit lines BLT and BLB is reversed by an offset voltage $V_{OS}$ according to a difference in a threshold voltage $V_{th}$ among transistors TR of the sense amp. In addition, a second factor is a sensing time fail (tSA fail) caused by the sense amplifier not sufficiently amplifying the sensed voltage difference $\Delta V_{BL}$ within a time required by a specification of the semiconductor memory apparatus (e.g., tRCD), even when the voltage difference $\Delta V_{BL}$ of the pair of bit lines BLT and BLB is normally sensed. In general, in order for an external device to normally recognize data, the sense amplifier must be able to amplify the voltage difference $V_{BL}$ of a pair of bit lines BL and BLB to 80% or more of a predetermined core voltage $V_{core}$ within a predetermined time (e.g., tRCD). That is, in order to prevent the sensing time fail (tSA fail), the sense amplifier must rapidly amplify the voltage difference $\Delta V_{BL}$ of the pair of bit lines BL and BLB or the activation latency tRCD must be increased, so that data is output after sufficient amplification, even when the sense amplifier slowly amplifies the voltage difference $\Delta V_{BL}$.

As described above, since an increase in latency causes a large bottleneck in overall system performance, it is important to improve the latency by allowing the sense amplifier to quickly amplify the voltage difference $\Delta V_{BL}$ in order to improve the performance of a memory system.

The most important factor that can improve the latency in DRAM is a sensing margin of the bit line sense amp.

The sensing margin is basically based on the voltage variation ΔV of the bit line BL generated by charge sharing with a voltage stored in a selected cell, but may be reduced by the offset voltage $V_{OS}$ according to a difference of the threshold voltage $V_{th}$ among the transistors TR of the sense amplifier and coupling noise according to an open bit line structure, so that the sensing margin may be calculated as shown in Equation 2.

$$\text{Sensing margin} = \Delta V_{BL} - (V_{OS} + \text{coupling noise}) \qquad \text{[Equation 2]}$$

In Equation 2, the voltage difference $\Delta V_{BL}$ of the pair of bit lines BL and BLB is a value obtained by subtracting a bit line bar voltage $V_{BLB}$ from the sum of the voltage $V_{BL}$ of the bit line BLT corresponding to a selected cell and a charge-sharing voltage $\Delta V_{CS}$ representing the voltage variation ΔV generated by the selected cell sharing a stored voltage with the bit line BLT according to data, and it is represented as shown in Equation 3.

$$\Delta V_{BL} = (V_{BLT} + \Delta V_{CS}) - V_{BLB} \qquad \text{[Equation 3]}$$

In addition, the charge-sharing voltage $\Delta V_{CS}$ is calculated as shown in Equation 4 according to a voltage difference between a cell voltage $V_{cell}$ and a bit line voltage $V_{BLT}$ ($V_{cell} - V_{BLT}$) and a ratio of a capacitance $C_{BL}$ of the bit line BLT and a cell capacitance $C_{cell}$.

$$\Delta V_{CS} = \frac{V_{cell} - V_{BLT}}{1 + (C_{BL} / C_{cell})} \qquad \text{[Equation 4]}$$

Here, the capacitance $C_{BL}$ of the bit line BLT may be calculated as shown in Equation 5 as the sum of a capacitance $C_{BL,\ cell} \times n$ according to the number n of cells connected to the bit line BL and a sense amplifier capacitance $C_{BL,\ SA}$ connected to the bit line BL in an open bit line structure.

$$C_{BL} = C_{BL,cell} \times n + C_{BL,SA} \qquad \text{[Equation 5]}$$

Meanwhile, as processes of semiconductor memory apparatus are scaling down, the cell capacitance $C_{cell}$ is reduced (e.g., $C_{cell}$<10 fF) and a variation range of the threshold voltage $V_{th}$ of the transistors is increased, and thus the voltage difference $\Delta V_{BL}$ between the pair of bit lines BLT and BLB is reduced, thereby reducing the sensing margin. In addition, as the offset voltage $V_{OS}$ of the sense amplifier increases, the sensing margin is reduced, and in some cases, as described above, a sign of the voltage difference $\Delta V_{BL}$ may be reversed by the offset voltage $V_{OS}$, thereby causing an offset fail of erroneously determining data.

In addition, due to the high integration of semiconductor memory apparatus, the ratio of the cell capacitance $C_{cell}$ to the bit line capacitance $C_{BL}$ increases to reduce the charge-sharing voltage $\Delta V_{CS}$, so that the voltage variation $\Delta V$ is further reduced. Moreover, the sensing margin is further reduced due to an increase in sensing time caused by a decrease in level of a driving voltage $V_{DD}$, an increase in coupling noise according to the open bit line structure, and the like.

Accordingly, in the past, sense amps having a structure capable of offset cancellation have been proposed to secure a sensing margin, but there is a problem in that an offset cancellation time tOC for cancelling the offset is additionally required, and thus the sensing time is further increased. That is, the offset cancellation time tOC also causes an increase in the sensing time, and thus there is a problem in that the latency (e.g., tRCD) required in a specification may not be satisfied.

SUMMARY

The present disclosure is directed to providing a bit line sense amplifier capable of increasing a sensing margin by removing a sense amplifier offset, and a semiconductor memory apparatus using the same.

Also, the present disclosure is directed to providing a bit line sense amplifier capable of reducing a sensing time while eliminating a sense amplifier offset, and a semiconductor memory apparatus using the same.

Also, the present disclosure is directed to providing a bit line sense amplifier capable of significantly improving a sensing margin with a dual sensing margin structure, and a semiconductor memory apparatus using the same.

Also, the present disclosure is directed to providing a bit line sense amplifier capable of suppressing an increase in size and cost by not requiring a pre-charge circuit configured to pre-charge a separate pair of bit lines, and a semiconductor memory apparatus using the same.

A bit line sense amplifier according to one exemplary embodiment of the present disclosure includes: a first inverter connected between a first pull-up power terminal and a first pull-down power terminal, and having an input terminal connected to a first sensing node, and an output terminal connected to a second inner bit line; a second inverter connected between a second pull-up power terminal and a second pull-down power terminal, and having an input terminal connected to a second sensing node, and an output terminal connected to a first inner bit line; a first capacitor connected between the first sensing node and the first inner bit line; a second capacitor connected between the second sensing node and the second inner bit line; an isolation unit configured to cut off a connection between the first inner bit line and a second bit line, and cut off a connection between the second inner bit line and a first bit line in a charge-sharing section; and an offset cancellation unit configured to connect the first sensing node to the second inner bit line, and the first inner bit line to the first bit line, respectively, and connect the second sensing node to the first inner bit line, and the second inner bit line to the second bit line, respectively, in an offset cancellation section included in the charge-sharing section.

The offset cancellation unit may include: a first offset cancellation unit configured to connect the first sensing node to the second inner bit line, and connect the first inner bit line to the first bit line in response to a first offset signal activated in a first offset cancellation section in the offset cancellation section; and a second offset cancellation unit configured to connect the second sensing node to the first inner bit line, and connect the second inner bit line to the second bit line in response to a second offset signal activated in a second offset cancellation section distinguished from the first offset cancellation section in the offset cancellation section.

Each of the first and second offset signals may be additionally activated in a pre-charge section before the charge-sharing section.

The first offset cancellation unit may include: an eleventh offset cancellation transistor connected between the first sensing node and the second inner bit line, and to which the first offset signal is applied to a gate; and a twelfth offset cancellation transistor connected between the first inner bit line and the first bit line, and to which the first offset signal is applied to a gate.

The second offset cancellation unit may include: a twenty-first offset cancellation transistor connected between the second sensing node and the first inner bit line, and to which the second offset signal is applied to a gate; and a twenty-second offset cancellation transistor connected between the second inner bit line and the second bit line, and to which the second offset signal is applied to a gate.

In the first pull-up power terminal, a core voltage of a predetermined voltage level may be applied to each main sensing section after the first offset cancellation section and the charge-sharing section, and a pre-charge voltage may be applied in the remaining sections, and in the first pull-down power terminal, a predetermined ground voltage may be applied to each of the first offset cancellation section and the main sensing section, and the pre-charge voltage may be applied in the remaining sections.

In the second pull-up power terminal, the core voltage may be applied to each of the second offset cancellation section and the main sensing section, and the pre-charge voltage may be applied in the remaining sections, and in the second pull-down power terminal, the ground voltage may be applied to each of the second offset cancellation section and the main sensing section, and the pre-charge voltage may be applied in the remaining sections.

The isolation unit may include: a first isolation transistor connected between the first inner bit line and the second bit line, and turned off by receiving an isolation signal deactivated during the charge-sharing section at a gate; and a second isolation transistor connected between the second inner bit line and the first bit line, and turned off by receiving the isolation signal at a gate.

A semiconductor memory apparatus using a bit line sense amplifier according to another exemplary embodiment of the present disclosure includes: a memory cell array including a plurality of memory cells defined by a plurality of word lines and a plurality of bit lines; and a plurality of bit line sense amps configured to sense and amplify a voltage difference between a first bit line corresponding to a memory cell appearing according to a data value stored in a memory cell selected by an activated word line among the plurality of word lines and a second bit line corresponding to an unselected memory cell, wherein each of the plurality of bit line sense amps includes: a first inverter connected between a first pull-up power terminal and a first pull-down power terminal, and having an input terminal connected to a first sensing node, and an output terminal connected to a second inner bit line; a second inverter connected between a second pull-up power terminal and second pull-down power terminal, and having an input terminal connected to a second sensing node, and an output terminal connected to a first inner bit line; a first capacitor connected between the first sensing node and the first inner bit line; a second capacitor connected between the second sensing node and the second inner bit line; an isolation unit configured to cut off a connection between the first inner bit line and a second bit line, and cut off a connection between the second inner bit line and a first bit line in a charge-sharing section; and an offset cancellation unit configured to connect the first sensing node to the second inner bit line, and the first inner bit line to the first bit line, respectively, and connect the second sensing node to the first inner bit line, and the second inner bit line to the second bit line, respectively, in an offset cancellation section included in the charge-sharing section.

Accordingly, in a bit line sense amplifier and a semiconductor memory apparatus using the same according to an exemplary embodiment of the present disclosure, a sensing margin is increased by adding a coupling capacitor and a small number of transistors to cancel the sense amplifier offset, and the offset is to be cancelled during a charge-sharing section, so that the sensing time due to offset cancellation is not increased. Moreover, by applying a dual sensing margin structure, the sensing margin can be significantly improved, and since a separate pre-charge circuit configured to pre-charge a pair of bit lines is not required, increase in size and cost can be suppressed.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
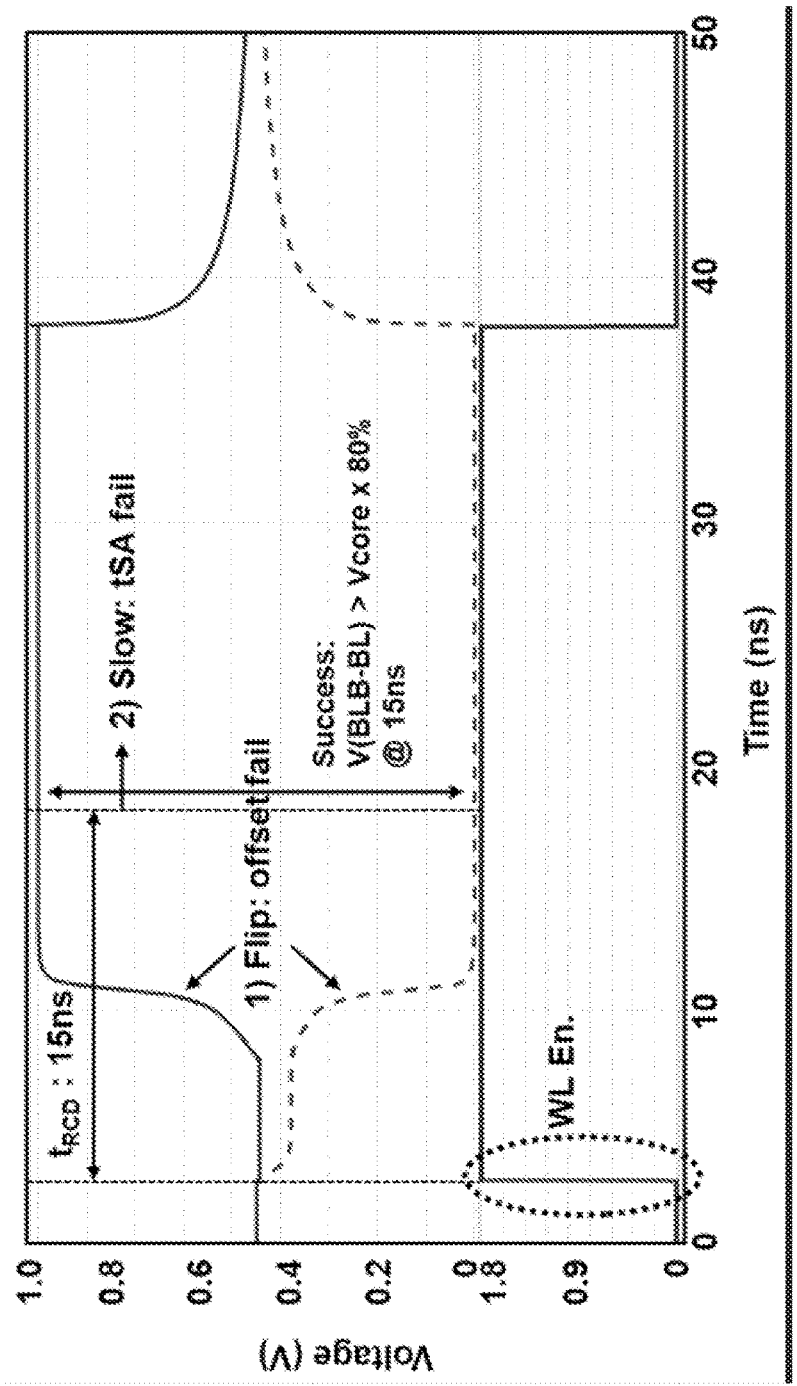
FIG. 1 is a view for describing a sensing yield according to an operation of a sense amp.

In order to fully understand the present disclosure, the operational advantages of the present disclosure, and the objects achieved by the practice of the present disclosure, the accompanying drawings illustrating exemplary embodiments of the present disclosure and the contents described in the accompanying drawings should be referred to.

Hereinafter, the present disclosure will be described in detail by describing exemplary embodiments of the present disclosure with reference to the accompanying drawings. However, the present disclosure may be embodied in various different forms and is not limited to the described embodiments. In addition, in order to clearly explain the present disclosure, parts irrelevant to the description are omitted, and the same reference numerals in the drawings indicate the same members.

Throughout the specification, when a part "includes" a certain component, it does not exclude other components, unless otherwise stated, meaning that other components may be further included. In addition, terms such as " . . . unit", " . . . group", "module", "block," and the like described in the specification mean a unit that processes at least one function or operation, which may be implemented as hardware, software, or a combination of hardware and software.

Figure 2:
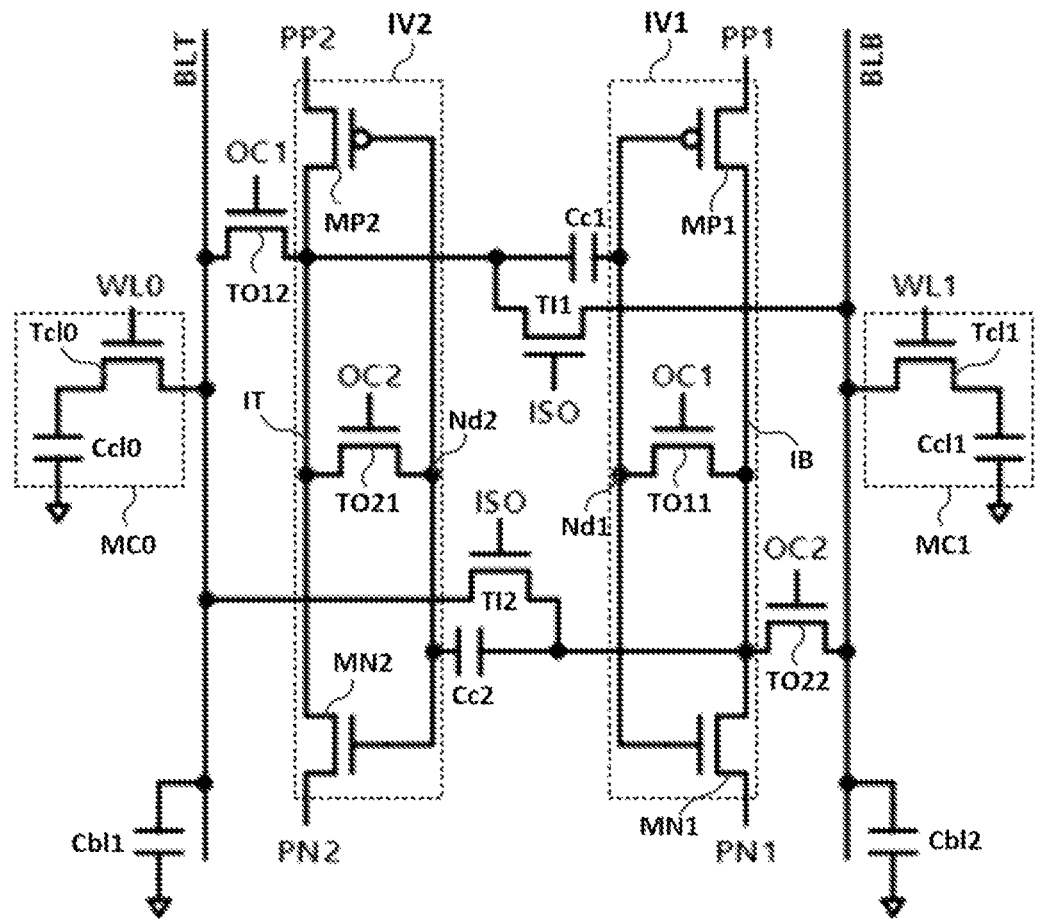
FIG. 2 is a view illustrating a bit line sense amplifier according to one exemplary embodiment of the present disclosure.
Figure 3:
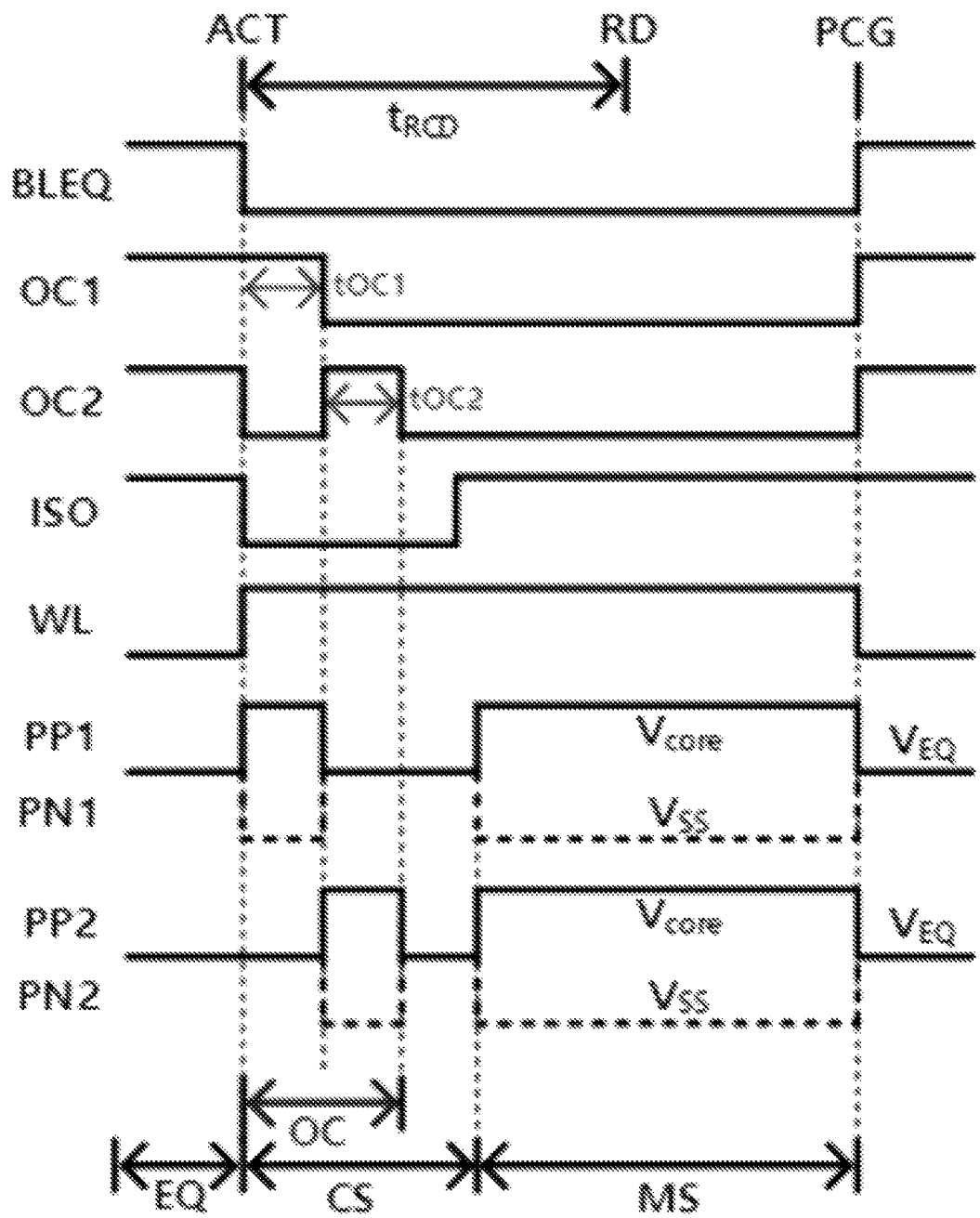
FIG. 3 is a timing diagram for describing an operation of the bit line sense amplifier shown in FIG. 2.

FIG. 2 is a view illustrating a bit line sense amplifier according to one exemplary embodiment of the present disclosure, and FIG. 3 is a timing diagram for describing an operation of the bit line sense amplifier shown in FIG. 2.

A bit line sense amplifier according to the present exemplary embodiment is provided between two bit lines adjacent to each other in a memory cell array each including a plurality of memory cells MC defined by a plurality of word lines WL and a plurality of bit lines BL. In addition, each of the plurality of sense amplifiers senses and amplifies a voltage difference between a first bit line BLT corresponding to a memory cell appearing according to a data value stored in a memory cell MC0 selected by an activated word line (here, for example, WL0) among the plurality of word lines WL, that is, a voltage stored in a cell capacitor Ccl0 of the memory cell MC0 and a second bit line BLB corresponding to an unselected memory cell (here, for example, MC1).

Referring to FIG. 2, the bit line sense amplifier according to the present exemplary embodiment includes two inverters IV1 and IV2, two capacitors Cc1 and Cc2, an isolation unit, and an offset cancellation unit.

A first inverter IV1 of the two inverters IV1 and IV2 is connected between a first pull-up power terminal PP1 and a first pull-down power terminal PN1 in which an input terminal is connected to a first sensing node Nd1, and an output terminal is connected to a second inner bit line IB. The first inverter IV1 includes a first pull-up transistor MP1 connected between the first pull-up power terminal PP1 and the second inner bit line IB, and a first pull-down transistor MN1 connected between the second inner bit line IB and the first pull-down power terminal PN1, and gates of the first pull-up transistor MP1 and the first pull-down transistor MN1 are commonly connected to the first sensing node Nd1.

In addition, a second inverter IV2 is connected between a second pull-up power terminal PP2 and a second pull-down power terminal PN2 in which an input terminal is connected to a second sensing node Nd2, and an output terminal is connected to a first inner bit line IT. The second inverter IV2 includes a second pull-up transistor MP2 connected between the second pull-up power terminal PP2 and the first inner bit line IT, and a second pull-down transistor MN2 connected between the first inner bit line IT and the second pull-down power terminal PN2, and gates of the second pull-up transistor MP2 and the second pull-down transistor MN2 are commonly connected to the second sensing node Nd2.

Accordingly, the first and second inverters IV1 and IV2 operate as sensing amplifiers configured to sense, invert, and amplify voltage levels of the first sensing node Nd1 and the second sensing node Nd2, respectively, and apply the voltage levels to the second inner bit line IB and the first inner bit line IT.

A first capacitor Cc1 of the two capacitors Cc1 and Cc2 is connected between the first sensing node Nd1 which is an input terminal of the first inverter IV1 and the first inner bit line IT which is an output terminal of the second inverter IV2, and a second capacitor Cc2 is connected between the second sensing node Nd2 which is an input terminal of the second inverter IV2 and the second inner bit line IB which is an output terminal of the first inverter IV1.

Each of the first and second capacitors Cc1 and Cc2 cancels an offset due to a difference of a threshold voltage $V_{th}$ between the first and second pull-up transistors MP1 and MP2 and the first and second pull-down transistors MN1 and MN2 of the first and second inverters IV1 and IV2 by charging a voltage variation ΔV appearing through charge-sharing between bit lines BLT corresponding to the cell capacitor Cc10 of the memory cell MC0 selected in a charge-sharing section CS which will be described below, and then discharging the voltage variation ΔV charged in a main sensing section MS. In particular, when the offset is cancelled, a voltage change occurring at the first sensing node Nd1 and the second sensing node Nd2 is blocked so as not to be transmitted to the bit lines BLT and BLB. That is, the voltage variation ΔV between the bit lines BLT appearing through the charge-sharing due to the offset cancellation is suppressed so as not to be changed.

Also, the first and second capacitors Cc1 and Cc2 allow a voltage difference between the first and second bit lines BLT and BLB to be amplified to twice the voltage variation ΔV according to a current path formed in the main sensing section MS.

The isolation unit connects the first inner bit line IT which is an output terminal of the second inverter IV2 and the second bit line BLB, and connects the second inner bit line IB which is an output terminal of the first inverter IV1 and the first bit line BLT in a pre-charge section EQ and the main sensing section MS, which will be described below. That is, the isolation unit cuts off a connection between the first inner bit line IT and the second bit line BLB, and a connection between the second inner bit line IB and the first bit line BLT during the charge-sharing section CS.

The isolation unit includes a first isolation transistor TI1 connected between the first inner bit line IT and the second bit line BLB, and to which an isolation signal ISO is applied to a gate, and a second isolation transistor TI2 connected between the second inner bit line IB and the first bit line BLT, and to which the isolation signal ISO is applied to a gate.

Meanwhile, the offset cancellation unit connects the first sensing node Nd1 to the second inner bit line IB, and the first inner bit line IT to the first bit line BLT, respectively, and connects the second sensing node Nd2 to the first inner bit line IT, and the second inner bit line IB to the second bit line BLB, respectively, in an offset cancellation section OC included in the charge-sharing section CS.

The offset cancellation unit includes a first offset cancellation unit connecting the first sensing node Nd1 and the second inner bit line IB, and connecting the first inner bit line IT and the first bit line BLT in response to a first offset signal OC1 activated in a first offset cancellation section tOC1 of the offset cancellation section OC, and a second offset cancellation unit connecting the second sensing node Nd2 and the first inner bit line IT, and connecting the second inner bit line IB and the second bit line BLB in response to a second offset signal OC2 activated in a second offset cancellation section tOC2 distinguished from the first offset cancellation section tOC1 of the offset cancellation section OC.

Here, the first offset cancellation unit includes an eleventh offset cancellation transistor TO11 connected between the first sensing node Nd1 and the second inner bit line IB, and to which the first offset signal OC1 is applied to a gate, and a twelfth offset cancellation transistor TO12 connected between the first inner bit line IT and the first bit line BLT, and to which the first offset signal OC1 is applied to a gate. In addition, the second offset cancellation unit includes a twenty-first offset cancellation transistor TO21 connected between the second sensing node Nd2 and the first inner bit line IT, and to which the second offset signal OC2 is applied to a gate, and a twenty-second offset cancellation transistor TO22 connected between the second inner bit line IB and the second bit line BLB, and to which the second offset signal OC2 is applied to a gate.

In FIG. 2, bit line capacitances Cb11 and Cb12 simply represent capacitances of the first bit line BLT and the second bit line BLB as a circuit, and are not components included in the semiconductor memory apparatus of the present exemplary embodiment.

As shown in FIG. 3, the operation of the sense amplifier during a read operation, that is, a data access operation, of the semiconductor memory apparatus according to the present exemplary embodiment may be divided into three sections such as a pre-charge section EQ, a charge-sharing section CS, and a main sensing section MS.

In the pre-charge section EQ, the word line WL is in a deactivated state, and the first and second offset cancellation signals OC1 and OC2 and the isolation signal ISO are in an activated state. In addition, a pre-charge voltage $V_{EQ}$ of a predetermined voltage level is applied to each of the first and second pull-up power terminals PP1 and PP2 and the first and second pull-down power terminals PN1 and PN2.

In addition, in the charge-sharing section CS, the word line WL0 corresponding to a row address applied to the semiconductor memory apparatus is selected and activated, and the isolation signal ISO is deactivated.

Meanwhile, in the sense amplifier of the present exemplary embodiment, the offset cancellation section OC is included in the charge-sharing section CS, and the offset cancellation section OC may be divided into the first offset cancellation section tOC1 and the second offset cancellation section tOC2.

During the first offset cancellation section tOC1, the first offset cancellation signal OC1 is activated, while the second offset cancellation signal OC2 is deactivated. At this time, a core voltage $V_{core}$ of a predetermined voltage level (for example, 1.1V) is applied to the first pull-up power terminal PP1 connected to the first inverter IV1, and a ground voltage $V_{SS}$ of a predetermined voltage level (for example, 0V) is applied to the first pull-down power terminal PN1. At this time, the pre-charge voltage $V_{EQ}$ is applied to the second pull-up power terminal PP2 and the second pull-down power terminal PN2 as it is. Here, the core voltage $V_{core}$ may have a voltage level equal to or less than a power supply voltage $V_{DD}$ of the semiconductor memory apparatus.

In addition, during the second offset cancellation section tOC2, the second offset cancellation signal OC2 is activated, and the first offset cancellation signal OC1 is deactivated. During the second offset cancellation section tOC2, the core voltage $V_{core}$ is applied to the second pull-up power terminal PP2 connected to the second inverter IV2, the ground voltage $V_{SS}$ is applied to the second pull-down power terminal PN2, and the pre-charge voltage $V_{EQ}$ is again applied to the first pull-up power terminal PP1 and the first pull-down power terminal PN1.

In the charge-sharing section CS, except for during the first and second offset cancellation sections tOC1 and tOC2, both the first and second offset cancellation signals OC1 and OC2 are deactivated, and the pre-charge voltage $V_{EQ}$ is again applied to each of the first and second pull-up power terminals PP1 and PP2 and the first and second pull-down power terminals PN1 and PN2.

The word line WL0 selected in the main sensing section MS maintains an activated state, and the isolation signal ISO deactivated during the charge-sharing section CS is activated again. In addition, the first and second offset cancellation signals OC1 and OC2 maintain a deactivated state. Meanwhile, the core voltage $V_{core}$ is applied to both the first and second pull-up power terminals PP1 and PP2, and the ground voltage $V_{SS}$ is applied to the first and second pull-down power terminals PN1 and PN2.

After the main sensing section MS, the pre-charge section EQ is repeated again.

Figure 4:
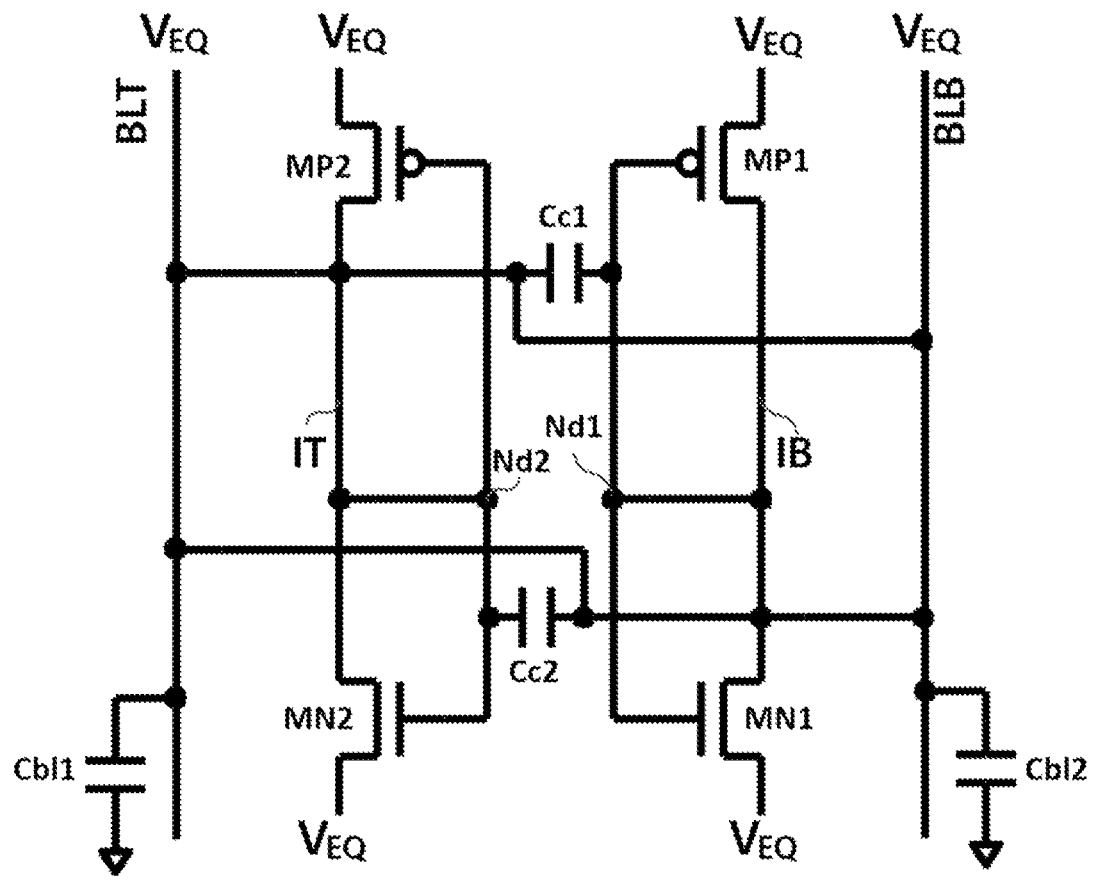
FIG. 4 is a view for describing an operation in a pre-charge section of the bit line sense amplifier of FIG. 2.

FIG. 4 is a view for describing an operation in a pre-charge section of the bit line sense amplifier of FIG. 2.

Since the word line WL is in a deactivated state during the pre-charge section EQ, the memory cells MC0 and MC1 are omitted in FIG. 4 as equivalent circuit representation. Also, during the pre-charge section EQ, the first and second offset cancellation signals OC1 and OC2 and the isolation signal ISO are in an activated state, and thus the eleventh and twelfth offset cancellation transistors TO11 and TO12, the twenty-first and twenty-second offset cancellation transistors TO21 and TO22, and the first and second isolation transistors TI1 and TI2 are turned on, so that the equivalently turned-on transistors TO11, TO12, TO21, TO22, TI1, and TI2 in FIG. 4 are expressed as connecting lines.

Accordingly, as shown in FIG. 4, the first sensing node Nd1 and the second inner bit line IB which are the input terminal and the output terminal of the first inverter IV1, and the second sensing node Nd2 and the first inner bit line IT which are the input terminal and the output terminal of the second inverter IV2 are electrically connected to each other, and the first and second inner bit lines IT and IB is connected to the first and second bit lines BLT and BLB, respectively. That is, the first and second sensing nodes Nd1 and Nd2, the first and second inner bit lines IT and IB, and the first and second bit lines BLT and BLB are all connected to each other.

In addition, since the pre-charge voltage $V_{EQ}$ of a predetermined voltage level is applied to each of the first and second pull-up power terminals PP1 and PP2 and the first and second pull-down power terminals PN1 and PN2, the first and second sensing nodes Nd1 and Nd2 and the first and second inner bit lines IT and IB are pre-charged with the pre-charge voltage $V_{EQ}$ by the first and second inverters IV1 and IV2, and the electrically connected first and second bit lines BLT and BLB are also pre-charged with the pre-charge voltage $V_{EQ}$.

Accordingly, the sense amplifier of the present exemplary embodiment may pre-charge the bit lines BLT and BLB with the pre-charge voltage $V_{EQ}$ by activating the first and second offset cancellation signals OC1 and OC2 and the isolation signal ISO during the pre-charge section EQ without providing a separate pre-charge circuit configured to pre-charge the bit lines BLT and BLB.

Figure 5:
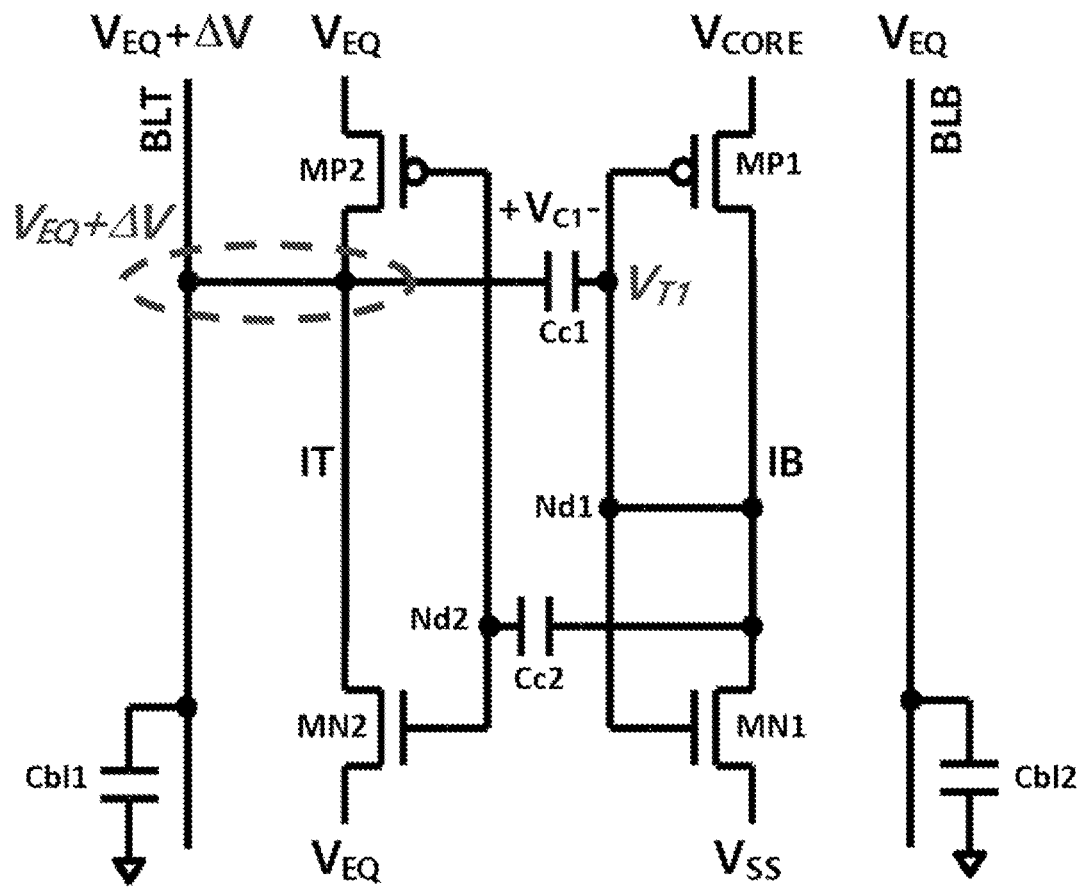
FIG. 5 is a view for describing an operation in a first offset cancellation section of the bit line sense amplifier of FIG. 2.

FIG. 5 is a view for describing an operation in a first offset cancellation section of the bit line sense amplifier of FIG. 2.

Since the first offset cancellation section tOC1 is included in the charge-sharing section CS, and the isolation signal ISO is deactivated in the charge-sharing section CS, as shown in FIG. 5, a connection between the second inner bit line IB and the first bit line BLT and a connection between the first inner bit line IT and the second bit line BLB are cut off.

Meanwhile, in the first offset cancellation section tOC1, the first offset cancellation signal OC1 is in an activated state, while the second offset cancellation signal OC2 is in a deactivated state. Accordingly, the eleventh and twelfth offset cancellation transistors TO11 and TO12 maintain a turned-on state, and the twenty-first and twenty-second offset cancellation transistors TO21 and TO22 are turned off.

Accordingly, as shown in FIG. 5, a connection between the first sensing node Nd1 and the second inner bit line IB and a connection between the first inner bit line IT and the first bit line BLT are maintained, while a connection between the second sensing node Nd2 and the first inner bit line IT and a connection between the second inner bit line IB and the second bit line BLB are cut off.

Meanwhile, in the charge-sharing section CS, the word line WL0 selected according to a row address is activated, so that a charge accumulated in the cell capacitor Ccl0 of the memory cell MC0 is shared with the first bit line BLT pre-charged with the pre-charge voltage $V_{EQ}$. Accordingly, the first bit line BLT has a voltage level $V_{EQ}+\Delta V$ that is changed by the voltage variation $\Delta V$ due to charge-sharing from the pre-charge voltage $V_{EQ}$, and the first inner bit line IT connected to the first bit line BLT also has the same voltage level $V_{EQ}+\Delta V$ as the first bit line BLT.

At this time, the pre-charge voltage $V_{EQ}$ is directly applied to the second pull-up power terminal PP2 and the second pull-down power terminal PN2 during the first offset cancellation section tOC1, while the core voltage $V_{core}$ is applied to the first pull-up power terminal PP1 connected to the first inverter IV1, and the ground voltage $V_{SS}$ is applied to the first pull-down power terminal PN1. In addition, since the input terminal of the first inverter IV1 is connected to the first bit line BLT and the first inner bit line IT through the first capacitor Cc1, and the input terminal and the output terminal of the first inverter IV1 are connected to each other, the input terminal of the first inverter IV1 has a level of a first offset voltage $V_{T1}$ from which an offset according to a difference of the threshold voltage $V_{th}$ between the first pull-up transistor MP1 and the first pull-down transistor MN1 of the first inverter IV1 is cancelled. Accordingly, a charge-shared voltage $V_{EQ}+\Delta V$ of the first bit line BLT and the first offset voltage $V_{T1}$ of the first inverter IV1 are applied to both ends of the first capacitor Cc1, and a voltage $V_{c1}=(V_{EQ}+\Delta V)-V_{T1}$ corresponding to a voltage difference of the both ends is stored. That is, in the first capacitor Cc1, the charge-shared voltage $V_{c1}=(V_{EQ}+\Delta V)-V_{T1}$ of the first bit line BLT in consideration of the offset voltage $V_{T1}$ of the first inverter IV1 is stored and the offset of the first inverter IV1 is cancelled.

Figure 6:
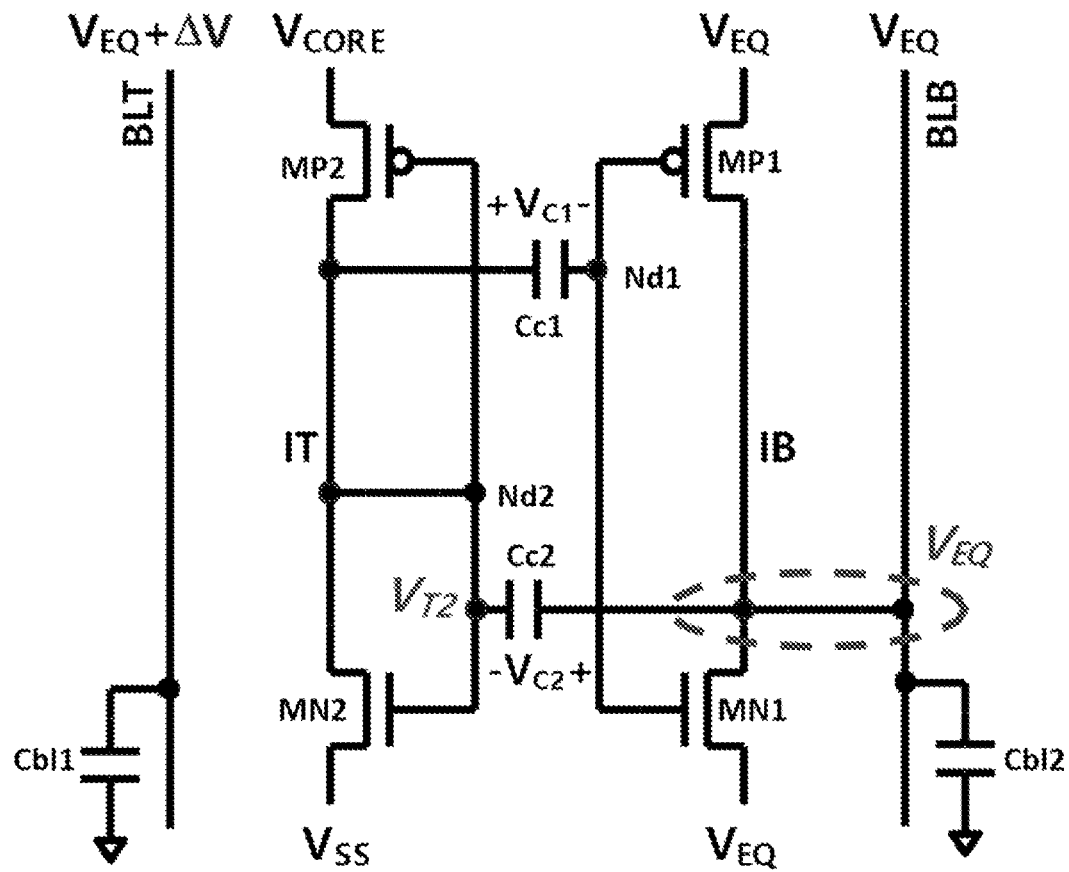
FIG. 6 is a view for describing an operation in a second offset cancellation section of the bit line sense amplifier of FIG. 2.

FIG. 6 is a view for describing an operation in a second offset cancellation section of the bit line sense amplifier of FIG. 2.

The second offset cancellation section tOC2 is also included in the charge-sharing section CS but is divided into a different time section from the first offset cancellation section tOC1. Since the second offset cancellation section tOC2 is also included in the charge-sharing section CS, the isolation signal ISO is deactivated, and thus a connection between the second inner bit line IB and the first bit line BLT and a connection between the first inner bit line IT and the second bit line BLB are maintained in a cut-off state.

In addition, the first offset cancellation signal OC1 is deactivated and the second offset cancellation signal OC2 is in an activated state in the second offset cancellation section tOC2, so that the twenty-first and twenty-second offset cancellation transistors TO21 and TO22 are turned on, and the eleventh and twelfth offset cancellation transistors TO11 and TO12 are turned off.

Accordingly, as shown in FIG. 6, the second sensing node Nd2, the first inner bit line IT, the second inner bit line IB, and the second bit line BLB are connected, and a connection between the first sensing node Nd1 and the second inner bit line IB and a connection between the first inner bit line IT and the first bit line BLT are cut off.

Since the second offset cancellation section tOC2 is also included in the charge-sharing section CS, the first bit line BLT has a voltage level $V_{EQ}+\Delta V$ that is changed by the voltage variation $\Delta V$ due to charge-sharing from the pre-charge voltage $V_{EQ}$ as it is. The first sensing node Nd1 has the first offset voltage $V_{T1}$ of the first inverter IV1 in the first offset cancellation section tOC1, but the first offset voltage $V_{T1}$ of the first sensing node Nd1 has little effect on the first bit line BLT due to the first capacitor Cc1. Accordingly, the first bit line BLT maintains the charge-shared voltage level $V_{EQ}+\Delta V$ as it is, even in the second offset cancellation section tOC2.

In addition, since a connection between the first bit line BLT and the first inner bit line IT is cut off, and instead the second inner bit line IB and the second bit line BLB are connected, the second inner bit line IB and the second bit line BLB have the pre-charge voltage $V_{EQ}$.

Meanwhile, the core voltage $V_{core}$ and the ground voltage $V_{SS}$ are each applied to the second pull-up power terminal PP2 and the second pull-down power terminal PN2 connected to the second inverter IV2 in the second offset cancellation section tOC2, and the pre-charge voltage $V_{EQ}$ is applied to the first pull-up power terminal PP1 and the first pull-down power terminal PN1 connected to the first inverter IV1. Since the input terminal of the second inverter IV2 is connected to the second bit line BLB and the second inner bit line IB through the second capacitor Cc2, and the input terminal and the output terminal of the second inverter IV2 are connected to each other, the input terminal of the second inverter IV2 has a second offset voltage level $V_{T2}$ from which an offset according to a difference of the threshold voltage $V_{th}$ between the second pull-up transistor MP2 and the second pull-down transistor MN2 of the second inverter IV2 is cancelled. Accordingly, a voltage $V_{EQ}$ of the second bit line BLB and the second offset voltage $V_{T2}$ of the second inverter IV2 are applied to both ends of the second capacitor Cc2, and a voltage $V_{c2}=V_{EQ}-V_{T2}$ corresponding to a voltage difference of the both ends is stored. That is, in the second capacitor Cc2, the voltage $Vc2=V_{EQ}-V_{T2}$ of the second bit line BLB in consideration of the offset voltage $V_{T2}$ of the second inverter IV2 is stored and the offset of the second inverter IV2 is cancelled.

In addition, as shown in FIG. 3, the charge-sharing section CS may be maintained for a certain section even after the first and second offset cancellation sections tOC1 and tOC2, but, since the first offset voltage $V_{T1}$ of the first sensing node Nd1 and the second offset voltage $V_{T2}$ of the second sensing node Nd2 have little effect on the first and second bit lines BLT and BLB due to the first and second capacitors Cc1 and Cc2, the first bit line BLT maintains the charge-shared voltage level $V_{EQ}+\Delta V$, and the second bit line BLB maintains the pre-charge voltage $V_{EQ}$.

Figure 7:
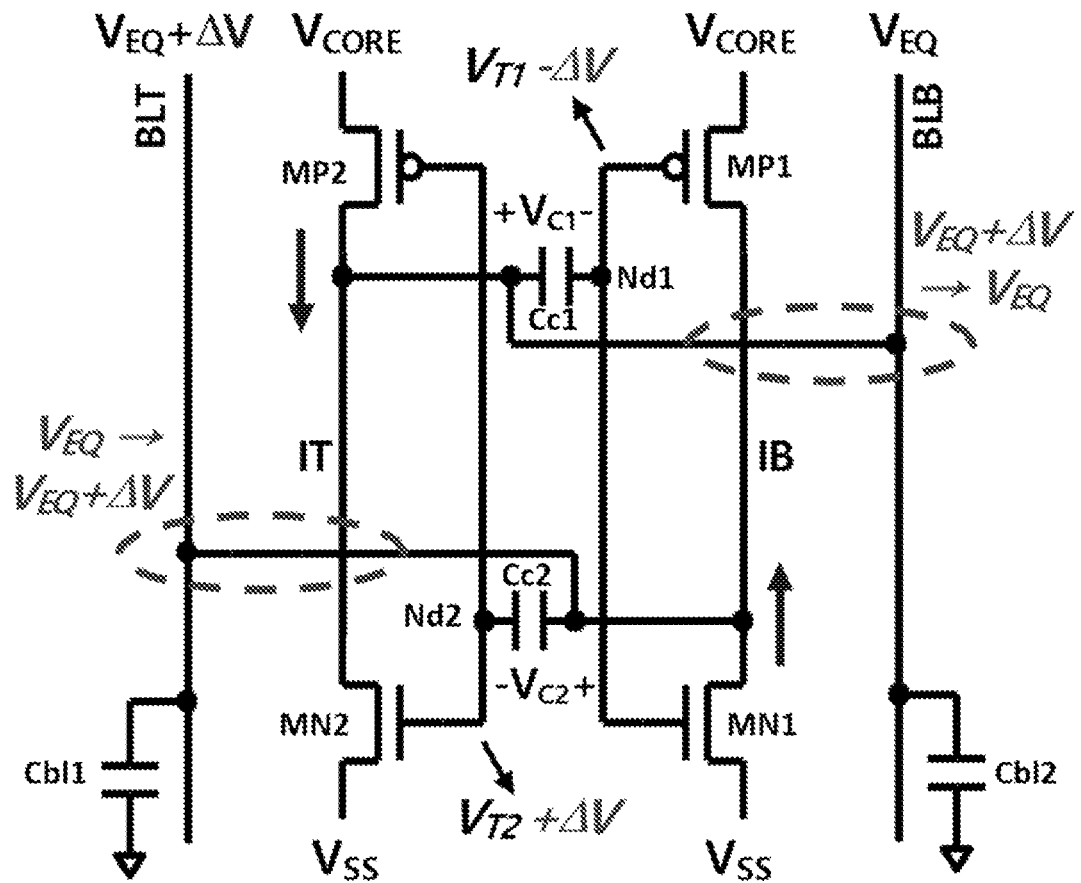
FIG. 7 is a view for describing an operation in a main sensing section of the bit line sense amplifier of FIG. 2.

FIG. 7 is a view for describing an operation in a main sensing section of the bit line sense amplifier of FIG. 2.

The word line WL0 and the isolation signal ISO selected in the main sensing section MS maintain an activated state. However, the first and second offset cancellation signals OC1 and OC2 maintain a deactivated state.

Accordingly, as shown in FIG. 7, the first inner bit line IT and the second bit line BLB, and the second inner bit line IB and the first bit line BLT maintain a state connected to each other, while a connection between the first sensing node Nd1 and the second inner bit line IB, a connection between the second sensing node Nd2 and the first inner bit line IT, a connection between the first inner bit line IT and the first bit line BLT, and a connection between the second inner bit line IB and the second bit line BLB are cut off. In addition, the core voltage $V_{core}$ is applied to both the first and second pull-up power terminals PP1 and PP2, and the ground voltage $V_{SS}$ is applied to the first and second pull-down power terminals PN1 and PN2.

The first bit line BLT and the second inner bit line IB are connected, and the first bit line BLT has a voltage level $V_{EQ}+\Delta V$ changed by the voltage variation $\Delta V$ from the pre-charge voltage $V_{EQ}$, while the second inner bit line IB maintains the pre-charge voltage $V_{EQ}$, so that a voltage difference corresponding to the voltage variation $\Delta V$ is generated. In addition, since the voltage $V_{c2}=V_{EQ}-V_{T2}$ obtained by subtracting the second offset voltage $V_{T2}$ of the second inverter IV2 from the pre-charge voltage $V_{EQ}$ is stored in the second capacitor Cc2, the second sensing node Nd2, which is the input terminal of the second inverter IV2, has a voltage level $V_{T2}+\Delta V$ to which the voltage variation $\Delta V$ in the second offset voltage $V_{T2}$ is reflected.

When the voltage of the second sensing node Nd2, which is the input terminal of the second inverter IV2, has a voltage level $V_{T2}+\Delta V$ in which the voltage variation $\Delta V$ is reflected in the second offset voltage $V_{T2}$ in which the second pull-up transistor MP2 and the second pull-down transistor MN2 are balanced with each other, the second pull-down transistor MN2 of the second inverter IV2 is turned on, and a current flows to the second pull-down power terminal PN2, so that the voltage level of the first inner bit line IT drops. In addition, since the first inner bit line IT and the second bit line BLB are connected, the voltage level of the second bit line BLB drops to the ground voltage $V_{SS}$.

Meanwhile, the second bit line BLB and the first inner bit line IT are connected, and the first inner bit line IT is connected to the first bit line BLT in the first offset cancellation section tOC1, and has a voltage level $V_{EQ}+\Delta V$ changed by the voltage variation $\Delta V$ from the pre-charge voltage $V_{EQ}$, so that the voltage variation $\Delta V$ is additionally reflected to the pre-charge voltage $V_{EQ}$ in the voltage level of the second bit line BLB. In addition, in the first capacitor Cc1, the charge-shared voltage $V_{c1}=(V_{EQ}+\Delta V)-V_{T1}$ of the first bit line BLT in consideration of the offset voltage $V_{T1}$ of the first inverter IV1 is stored. Accordingly, the first sensing node Nd1, which is the input terminal of the first inverter IV1, has a voltage level $V_{T1}-\Delta V$ in which the voltage variation $\Delta V$ is reflected in the first offset voltage $V_{T1}$.

As the voltage level of the first sensing node Nd1, which is the input terminal of the first inverter IV1, is changed from the first offset voltage $V_{T1}$ in which the first pull-up transistor MP1 and the first pull-down transistor MN1 are balanced with each other to the voltage level $V_{T1}-\Delta V$ in which the voltage variation $\Delta V$ is reflected, the first pull-up transistor MP1 is turned on and a current flows through the first pull-up transistor MP1, so that the voltage level of the second inner bit line IB rises. In addition, since the second inner bit line IB and the first bit line BLT are connected, the voltage level of the first bit line BLT rises to the core voltage $V_{core}$.

As a result, the first and second inverters IV1 and IV2 sense a voltage difference between the first and second bit lines BLT and BLB, and the sensed voltage difference is inverted and amplified to be represented as levels of the ground voltage $V_{SS}$ and the core voltage $V_{core}$ on each of the first and second inner bit lines IT and IB.

As a result, in the bit line sense amplifier according to the present exemplary embodiment, since the first and second offset cancellation sections tOC1 and tOC2 are included together in the charge-sharing section CS, an offset of the first and second inverters IV1 and IV2 can be cancelled without an additional time increase for offset cancellation, and thus a large sensing margin can be secured. Moreover, since a voltage difference between the first and second bit lines BLT and BLB may be close to twice the voltage variation ΔV, a very large sensing margin can be secured by a dual sensing margin structure, and a sensing error probability of erroneously determining data stored in the memory cell MC0 can be greatly reduced. Accordingly, the sense amplifier according to the present exemplary embodiment can greatly improve latency by increasing a sensing yield of the semiconductor memory apparatus, and can improve the performance of the semiconductor memory apparatus.

Although the present disclosure has been described with reference to the exemplary embodiments shown in the drawings, these are merely exemplary, and those skilled in the art will understand that various modifications and equivalent other embodiments are possible therefrom.

Accordingly, the true technical protection scope of the present disclosure should be defined by the technical spirit of the appended claims.

What is claimed is:

1. A bit line sense amplifier, comprising:
a first inverter connected between a first pull-up power terminal and a first pull-down power terminal, and having an input terminal connected to a first sensing node and an output terminal connected to a second inner bit line;
a second inverter connected between a second pull-up power terminal and a second pull-down power terminal, and having an input terminal connected to a second sensing node and an output terminal connected to a first inner bit line;
a first capacitor connected between the first sensing node and the first inner bit line;
a second capacitor connected between the second sensing node and the second inner bit line;
an isolation unit configured to cut off a connection between the first inner bit line and a second bit line, and cut off a connection between the second inner bit line and a first bit line in a charge-sharing duration; and
an offset cancellation unit configured to connect the first sensing node to the second inner bit line, and the first inner bit line to the first bit line, respectively, and connect the second sensing node to the first inner bit line, and the second inner bit line to the second bit line, respectively, in an offset cancellation duration included in the charge-sharing duration.

2. The bit line sense amplifier of claim 1, wherein the offset cancellation unit includes: a first offset cancellation unit configured to connect the first sensing node to the second inner bit line, and connect the first inner bit line to the first bit line in response to a first offset signal activated in a first offset cancellation duration in the offset cancellation unit; and
a second offset cancellation unit configured to connect the second sensing node to the first inner bit line, and connect the second inner bit line to the second bit line in response to a second offset signal activated in a second offset cancellation duration distinguished from the first offset cancellation duration in the offset cancellation unit.

3. The bit line sense amplifier of claim 2, wherein each of the first and second offset signals is additionally activated in a pre-charge duration before the charge-sharing duration.

4. The bit line sense amplifier of claim 3, wherein the first offset cancellation unit includes: an eleventh offset cancellation transistor connected between the first sensing node and the second inner bit line, and to which the first offset signal is applied to a gate; and
a twelfth offset cancellation transistor connected between the first inner bit line and the first bit line, and to which the first offset signal is applied to a gate.

5. The bit line sense amplifier of claim 4, wherein the second offset cancellation unit includes: a twenty-first offset cancellation transistor connected between the second sensing node and the first inner bit line, and to which the second offset signal is applied to a gate; and
a twenty-second offset cancellation transistor connected between the second inner bit line and the second bit line, and to which the second offset signal is applied to a gate.

6. The bit line sense amplifier of claim 3, wherein a core voltage of a predetermined voltage level is applied to the first pull-up power terminal in a main sensing duration after the first offset cancellation duration and the charge-sharing duration, and a pre-charge voltage is applied to the first pull-up power terminal in other durations, and
a predetermined ground voltage is applied to the first pull-down power terminal in the main sensing duration, and the pre-charge voltage is applied to the first pull-down power terminal in the other durations.

7. The bit line sense amplifier of claim 6, wherein the core voltage is applied to the second pull-up power terminal in each of the second offset cancellation duration and the main sensing duration, and the pre-charge voltage is applied to the second pull-up power terminal in the other durations, and
the ground voltage is applied to the second pull-down power terminal in each of the second offset cancellation duration and the main sensing duration, and the pre-charge voltage is applied to the second pull-down power terminal in the other durations.

8. The bit line sense amplifier of claim 3, wherein the isolation unit includes: a first isolation transistor connected between the first inner bit line and the second bit line, and turned off by receiving an isolation signal deactivated during the charge-sharing duration at a gate; and
a second isolation transistor connected between the second inner bit line and the first bit line, and turned off by receiving the isolation signal at a gate.

9. A semiconductor memory apparatus, comprising:
a memory cell array including a plurality of memory cells defined by a plurality of word lines and a plurality of bit lines; and
a plurality of bit line sense amps configured to sense and amplify a voltage difference between a first bit line corresponding to a memory cell appearing according to a data value stored in a memory cell selected by an activated word line among the plurality of word lines and a second bit line corresponding to an unselected memory cell,
wherein each of the plurality of bit line sense amps includes:
a first inverter connected between a first pull-up power terminal and a first pull-down power terminal, and having an input terminal connected to a first sensing node and an output terminal connected to a second inner bit line;
a second inverter connected between a second pull-up power terminal and a second pull-down power terminal, and having an input terminal connected to a second sensing node and an output terminal connected to a first inner bit line;
a first capacitor connected between the first sensing node and the first inner bit line;
a second capacitor connected between the second sensing node and the second inner bit line;
an isolation unit configured to cut off a connection between the first inner bit line and a second bit line, and cut off a connection between the second inner bit line and a first bit line in a charge-sharing duration; and
an offset cancellation unit configured to connect the first sensing node to the second inner bit line, and the first inner bit line to the first bit line, respectively, and connect the second sensing node to the first inner bit line, and the second inner bit line to the second bit line, respectively, in an offset cancellation duration included in the charge-sharing duration.

10. The semiconductor memory apparatus of claim 9, wherein the offset cancellation unit includes: a first offset cancellation unit configured to connect the first sensing node to the second inner bit line, and connect the first inner bit line to the first bit line in response to a first offset signal activated in a first offset cancellation duration in the offset cancellation duration; and
a second offset cancellation unit configured to connect the second sensing node to the first inner bit line, and connect the second inner bit line to the second bit line in response to a second offset signal activated in a second offset cancellation duration distinguished from the first offset cancellation duration in the offset cancellation duration.

11. The semiconductor memory apparatus of claim 10, wherein each of the first and second offset signals is additionally activated in a pre-charge duration before the charge-sharing duration.

12. The semiconductor memory apparatus of claim 11, wherein the first offset cancellation unit includes: an eleventh offset cancellation transistor connected between the first sensing node and the second inner bit line, and to which the first offset signal is applied to a gate; and
a twelfth offset cancellation transistor connected between the first inner bit line and the first bit line, and to which the first offset signal is applied to a gate.

13. The semiconductor memory apparatus of claim 12, wherein the second offset cancellation unit includes: a twenty-first offset cancellation transistor connected between the second sensing node and the first inner bit line, and to which the second offset signal is applied to a gate; and
a twenty-second offset cancellation transistor connected between the second inner bit line and the second bit line, and to which the second offset signal is applied to a gate.

14. The semiconductor memory apparatus of claim 11, wherein a core voltage of a predetermined voltage level is applied to the first pull-up power terminal in a main sensing duration after the first offset cancellation duration and the charge-sharing duration, and a pre-charge voltage is applied to the first pull-up power terminal in other durations, and
a predetermined ground voltage is applied to the first pull-down power terminal in the main sensing duration, and the pre-charge voltage is applied to the first pull-down power terminal in the other durations.

15. The semiconductor memory apparatus of claim 14, wherein the core voltage is applied to the second pull-up power terminal in each of the second offset cancellation duration and the main sensing duration, and the pre-charge voltage is applied the second pull-up power terminal in the other durations, and
the ground voltage is applied to the second pull-down power terminal in each of the second offset cancellation duration and the main sensing duration, and the pre-charge voltage is applied to the second pull-down power terminal in the other durations.

16. The semiconductor memory apparatus of claim 11, wherein the isolation unit includes: a first isolation transistor connected between the first inner bit line and the second bit line, and turned off by receiving an isolation signal deactivated during the charge-sharing duration at a gate; and
a second isolation transistor connected between the second inner bit line and the first bit line, and turned off by receiving the isolation signal at a gate.

17. The semiconductor memory apparatus of claim 15, wherein in the memory cell array, a word line corresponding to a row address is activated during the charge-sharing duration and the main sensing duration.

* * * * *